United States Patent [19]

Crowley et al.

[11] Patent Number: 4,984,902
[45] Date of Patent: Jan. 15, 1991

[54] APPARATUS AND METHOD FOR COMPENSATING FOR ERRORS IN TEMPERATURE MEASUREMENT OF SEMICONDUCTOR WAFERS DURING RAPID THERMAL PROCESSING

[75] Inventors: John L. Crowley; Ahmad Kermani, both of Fremont; Stephan E. Lassig, Milpitas; Noel H. Johnson, San Jose; Gary R. Rickords, Fremont, all of Calif.

[73] Assignee: Peak Systems, Inc., Fremont, Calif.

[21] Appl. No.: 510,357

[22] Filed: Apr. 17, 1990

Related U.S. Application Data

[62] Division of Ser. No. 337,628, Apr. 13, 1989.

[51] Int. Cl.$^5$ .............................................. G01R 15/00
[52] U.S. Cl. ........................................ 374/1; 374/126; 374/128; 374/129
[58] Field of Search .................... 374/1, 2, 9, 126, 128, 374/129, 133

[56] References Cited

U.S. PATENT DOCUMENTS

| | | | |
|---|---|---|---|
| 3,745,830 | 7/1973 | Smith, Jr. | 374/128 |
| 3,796,099 | 3/1974 | Shimotsuma | 374/9 |
| 4,579,461 | 4/1986 | Rudolph | 374/126 |
| 4,755,654 | 7/1988 | Crowley et al. | 219/411 |
| 4,761,539 | 8/1988 | Carmean | 374/1 |
| 4,764,026 | 8/1988 | Powell et al. | 374/7 |
| 4,823,291 | 4/1989 | Berman | 374/124 |
| 4,854,727 | 8/1989 | Pecot et al. | 374/57 |
| 4,919,542 | 4/1990 | Nulman et al. | 374/126 |

FOREIGN PATENT DOCUMENTS

| | | | |
|---|---|---|---|
| 3115887 | 11/1982 | Fed. Rep. of Germany | 374/126 |
| 55-26464 | 2/1980 | Japan | 374/126 |
| 56-104226 | 8/1981 | Japan | 374/128 |
| 0109826 | 6/1983 | Japan | 374/128 |
| 61-130834 | 6/1986 | Japan | 374/133 |
| 1418579 | 8/1988 | U.S.S.R. | 374/129 |
| 2082767 | 3/1981 | United Kingdom | 374/128 |

OTHER PUBLICATIONS

Avedissian, M. E., "Infrared Temperature Measuring System," Western Electric Technical Digest No. 2 (Apr. 1966).

Bernard, B., "Determining Emissivity," Instruments and Control Systems, vol. 37, No. 5, pp. 87-89, (May 1964).

*Primary Examiner*—William A. Cuchlinski, Jr.
*Assistant Examiner*—Diego F. F. Gutierrez
*Attorney, Agent, or Firm*—Townsend and Townsend

[57] ABSTRACT

The present invention is an apparatus for calibrating a temperature feedback value in a water processing chamber to automatically compensate for variations in infrared emissions from a heated semiconductor wafer due to variations in composition and coatings from wafer to wafer. A calibration wafer with an imbedded thermocouple is used to generate a table relating actual wafer temperatures to power supplied to the heating chamber and infrared emissions detected by a pyrometer. A sample wafer of a batch to be processed is subsequently placed in the chamber at a known power level, and any difference between the detected infrared emission value and the value in the table is used to adjust the entire table according to a first predetermined formula or table. Before each wafer is processed, a known source of infrared light is reflected off the wafer and detected. The reflected light value is compared to a reflection measurement for the sample wafer. The difference in reflection measurements is correlated to emissions from heating, and the calibration table is fine-tuned with the correlation value according to a second predetermined formula or table to account for variations in emissions between individual wafers due to variances in wafer surface conditions.

7 Claims, 4 Drawing Sheets

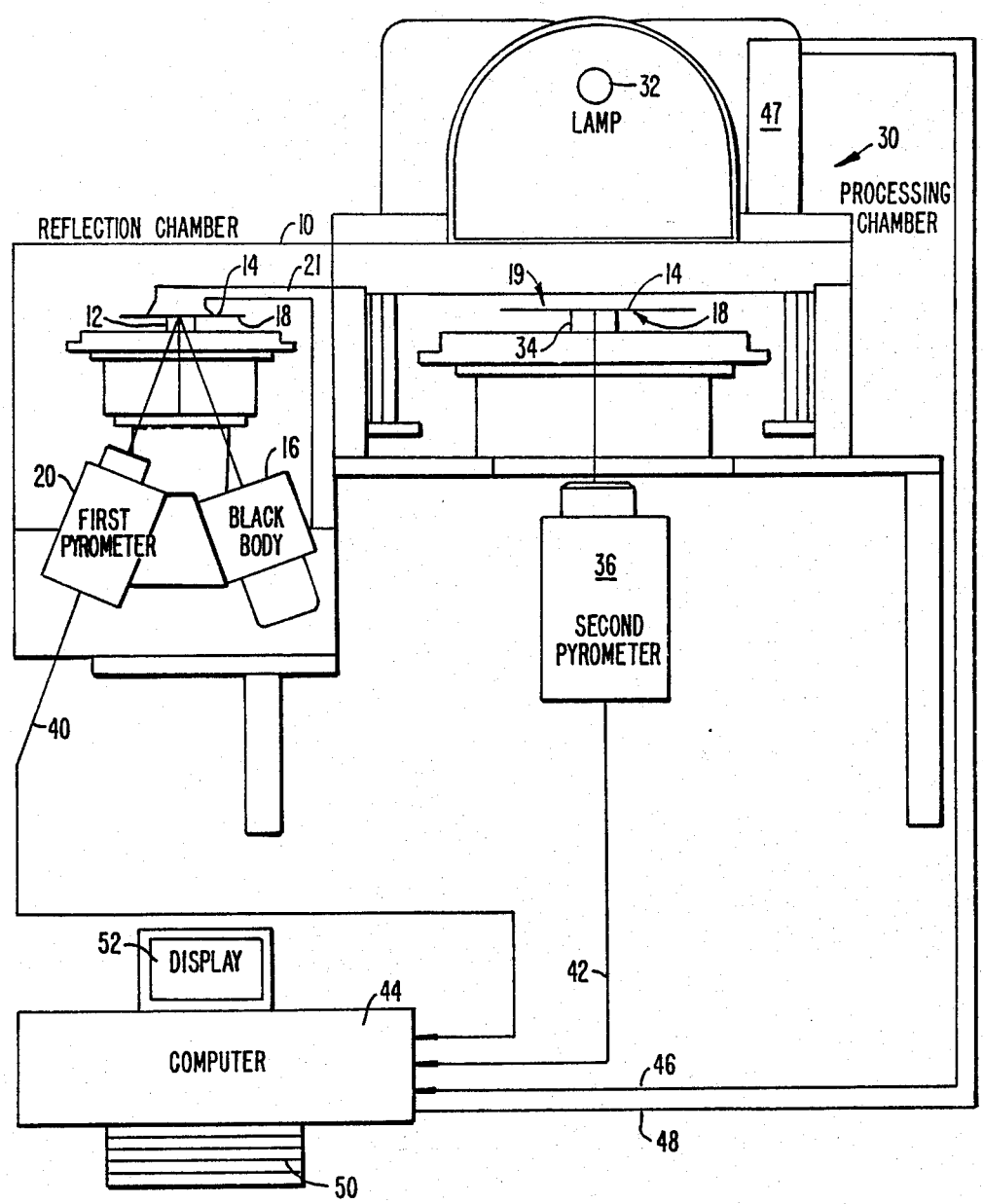
FIG.—1.

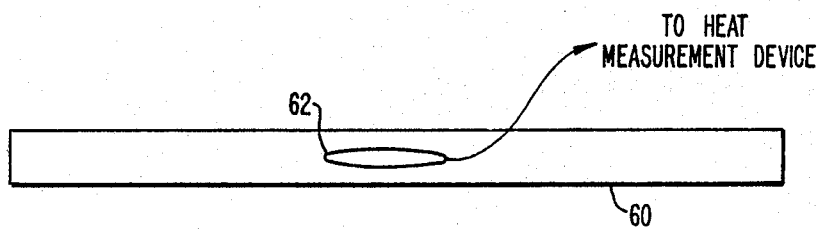
FIG._2.
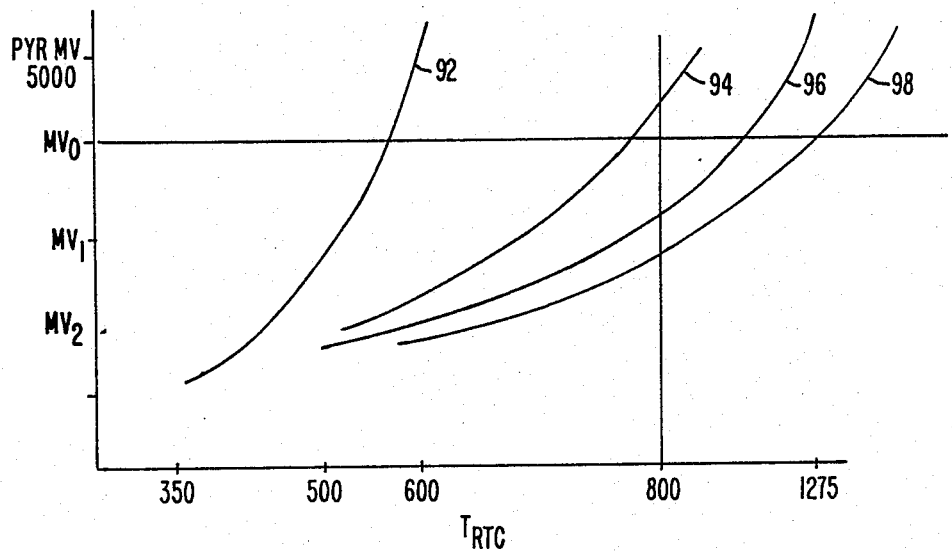
FIG._3.

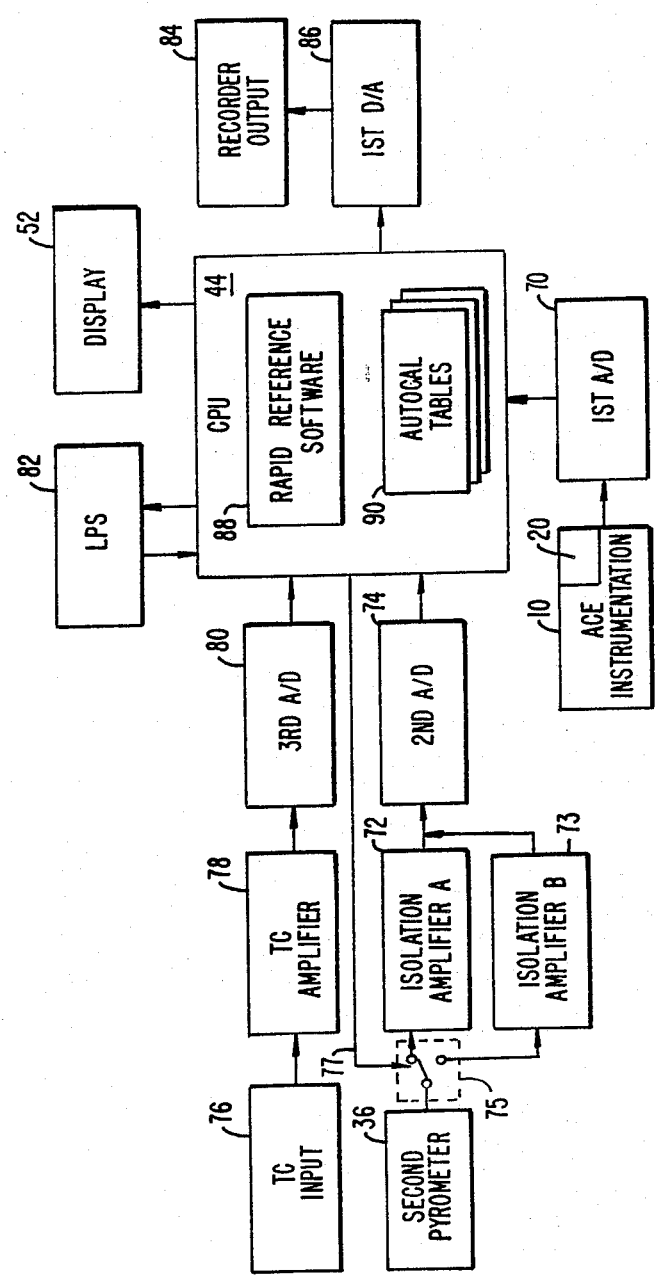
FIG._4.

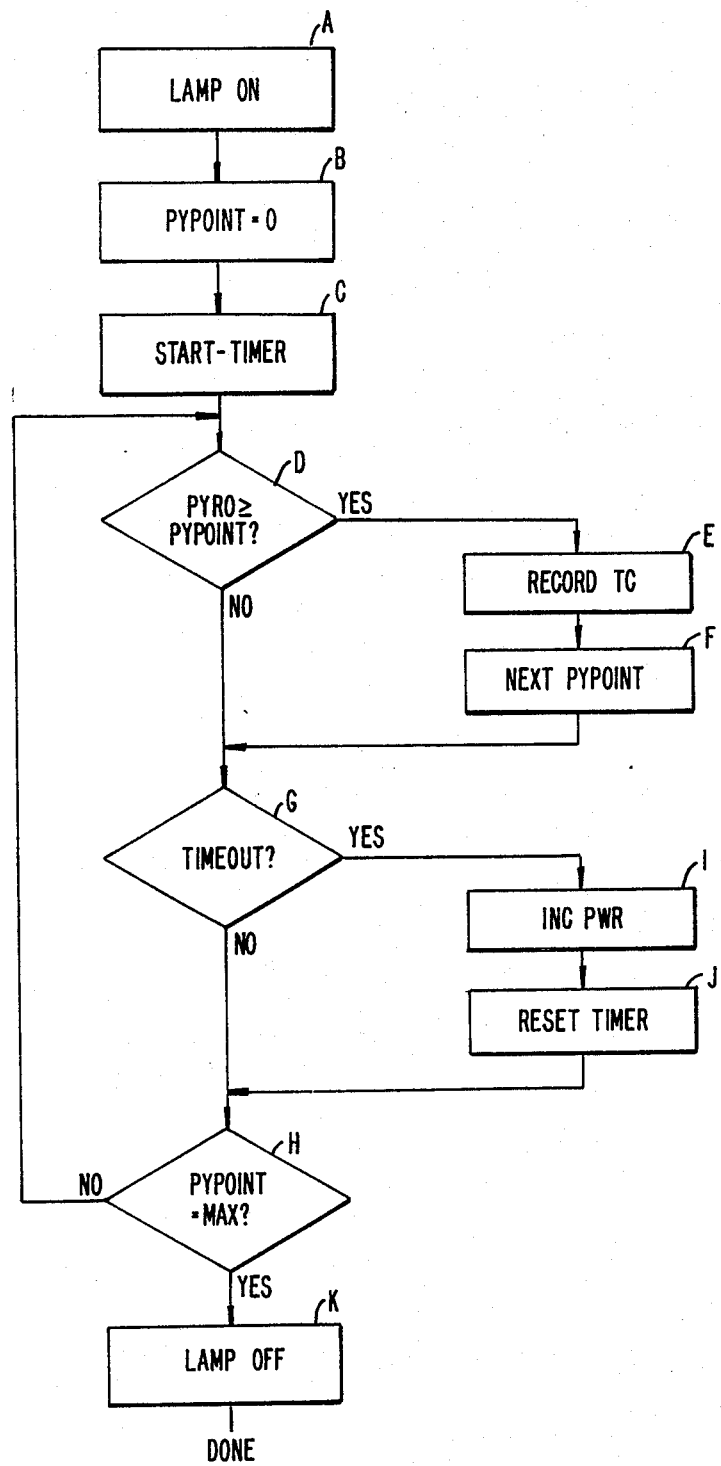
FIG._5.

APPARATUS AND METHOD FOR COMPENSATING FOR ERRORS IN TEMPERATURE MEASUREMENT OF SEMICONDUCTOR WAFERS DURING RAPID THERMAL PROCESSING

BACKGROUND OF THE INVENTION

The present invention relates to a method and apparatus for calibrating a light emission measurement heating chamber to automatically compensate for varying backside conditions on a semiconductor wafer.

Recently, there has been a trend toward single wafer processing of semiconductor wafers, rather than batch processing. Single wafer processing ensures that the processing of each wafer is more precise and that there is a higher level of consistency between wafers Therefore, when the wafer is transformed into its final form, it functions more predictably and more accurately. As increasing densities of components on wafers are developed, the need for very precise processing increases. In order to achieve throughputs similar to conventional wafer ovens which process a large number of wafers at once, a rapidly heating arc lamp is used, instead of a heating element, to speed up the processing time.

Apparatus for rapid thermal processing of semiconductor wafers are known in the prior art For example, U.S. Pat. No. 4,755,654 (hereinafter 654) discloses a semiconductor wafer heating chamber for applying either a desired uniform or non-uniform heating pattern to a wafer. The apparatus of 654 includes a long-arc AC gas-discharge lamp with a spectral output tuned for absorption by silicon. The lamp is capable of quickly raising the temperature of the wafer to a desired process temperature and holding it there for the time period necessary to accomplish the specific step of the process. Since the lamp heats the wafer quickly, the apparatus of 654 can be used efficiently to process wafers one at a time. The lamp heats the wafer with light directed to the top, or front side, of the wafer. A pyrometer is used to detect the infrared light emitted from the backside of the wafer when it is heated. This light is proportional to the temperature of the wafer. The pyrometer output is provided as a feedback to the heating system.

A pyrometer works by measuring the amount of radiation emitted in a certain spectral band (or bands) from the object to be measured. All objects emit radiation if they are at any temperature above absolute zero. The emitted radiation can be described quantitatively in a very simple form by the Stefan-Boltzmann Law. The radiant energy equals the emissivity times the Stefan Boltzmann constant times the temperature to the fourth power.

The spectral content of this radiation can also be determined using Plank's Law. Since one can calculate the amount of radiation emitted and the spectral distribution of the radiation, it should be simple to measure the radiation and work backwards to calculate the temperature. This would be true except that the factor "emissivity" is not, in most cases, a known constant. In fact, it is usually not a constant at all, but a function of wavelength and temperature. Therefore, to use pyrometry to accurately measure temperature, one must calibrate the system by effectively measuring "emissivity".

The calibration of the pyrometer feedback value indicating the temperature of the heating chamber is critical in the processing of a particular wafer. Presently, calibration of pyrometers used in wafer processing ovens is accomplished manually. The pyrometer is exposed to a light of a known value and the gain of the pyrometer output is adjusted to the desired value for such value of light using a potentiometer.

SUMMARY OF THE INVENTION

The present invention is a method and apparatus for calibrating a temperature feedback value in a wafer processing chamber to automatically compensate for variations in infrared emissions from a heated semiconductor wafer due to variations in composition and coatings from wafer to wafer. A calibration wafer with an imbedded thermocouple is used to generate a table relating actual wafer temperatures to power supplied to the heating chamber and infrared emissions detected by a pyrometer. A sample wafer of a batch to be processed is subsequently placed in the chamber at a known power level, and any difference between the detected infrared emission value and the value in the table is used to adjust the entire table according to a first predetermined formula or table. Before each wafer is processed, a known source of infrared light is reflected off the wafer and detected. The reflected light value is compared to a reflection measurement for the sample wafer. The difference in reflection measurements is correlated to emissions from heating, and the calibration table is fine-tuned with the correlation value according to a second predetermined formula or table to account for variations in emissions between individual wafers due to variances in wafer surface conditions.

In a preferred embodiment, the apparatus includes two pyrometers. The first pyrometer is located in a reflection chamber adjacent to the heating chamber where a reflectivity test is performed on wafers before they are placed in the heating chamber. A black body radiation source is mounted adjacent to the first pyrometer in the reflection chamber and provides infrared light aimed at the wafer. The infrared light which is reflected off of the wafer is measured by the first pyrometer.

A second pyrometer is used to detect the amount of infrared light emitted by a wafer during heat processing in the processing chamber. The "frontside", or top, of the wafer is illuminated and heated by an arc lamp near the top of the chamber. The second pyrometer, mounted at the bottom of the chamber, detects infrared emissions from the "backside", or bottom, of the wafer. A computer has inputs connected to the two pyrometers and an output which controls the power source of the processing chamber.

The operation of the present invention to perform precise calibration is carried out in a series of steps. First, a thermocouple wafer is introduced into the processing chamber. A thermocouple wafer is a semiconductor wafer provided with an imbedded thermocouple to detect is core temperature. It is used for calibration purposes only and is not processed. A series of known power levels are applied to the heating element of the processing chamber and the resulting temperature and amount of light emitted by the wafer at each power level is recorded in a calibration table.

A second wafer without a thermocouple device is then introduced into the processing chamber. The second wafer is a "batch" wafer with representative backside characteristics from a particular batch of wafers. A particular power level with a corresponding known temperature (from the set of values applied to the thermocouple wafer) is applied to the second wafer. The corresponding light emission value for the particular power level for the second wafer is detected. The difference between this value and the corresponding value for the thermocouple wafer is noted. This difference is used to revise the light emission values in the calibration table to produce a new, batch-specific calibration table.

Preferably, the front side of the second wafer is stripped, so that any coatings or surface conditions do not affect the amount of light absorbed, and thus the temperature achieved, for a given light intensity. Alternatively, an error factor can be built in to account for less or more light being absorbed resulting in too low or too high a temperature for the energy emitted.

Optinally the second batch wafer may be introduced into the reflectivity chamber to obtain greater accuracy in some cases. The black body radiation source is activated to provide infrared light which is reflected off of the wafer. The amount of light reflected is measured by the first pyrometer. The reflected light value is stored in memory. Each wafer to be processed is passed through the reflectivity chamber, and a similar measurement is done. The difference between the reflectivity measurement for a current wafer and the second, batch wafer is calculated. This difference is converted to an emissivity correction factor for each emissivity value and is used to revise the batch specific calibration table to produce a new, wafer specific calibration table. This wafer specific table will be used by the computer to adjust the pyrometer feedback value for any desired processing. Each wafer to be processed will have a separate wafer specific calibration table. Alternatively, the batch wafer temperature measurement could be omitted, with only the thermocouple wafer and reflectivity measurements being done.

The precise calibration is completed automatically so that there is no room for operator error. The computer makes all the data manipulations and sets the heating chamber for processing according to the information provided. The calibration for a batch of wafers is fast because only a single measurement for a single temperature is needed to adjust the entire table. The reflection measurement for individual wafers is even faster, since there is no need to wait for the oven to heat. Additionally, the calibration technique is fast because it is carried out by the computer. There is no need for manual adjustments.

The advantages achieved by the use of the calibration apparatus and method are numerous. First, the consistency of operation between wafers of similar composition is increased. This is because each wafer is precisely processed according to its own particular characteristics demonstrated before processing. By taking the particular characteristics of the wafer into account during processing, the final form of each wafer more closely approaches that of any other processed wafer.

For a more complete understanding of the nature and advantages of the invention, reference should be made to the ensuing detailed description taken in conjunction with the accompanying drawings.

BRIEF DESCRIPTION OF THE DRAWINGS

FIG. 1 is a diagram illustrating the arrangement of the components of the calibration apparatus according to a preferred embodiment of the present invention;

FIG. 2 is an illustration of the thermocouple wafer used to obtain initial semiconductor wafer characteristics according to a preferred embodiment of the present invention;

FIG. 3 is a chart of the pyrometer voltage level versus temperature of particular wafer measured by a preferred embodiment of the present invention;

FIG. 4 is a block diagram of the electronics used to implement a preferred embodiment of the present invention; and FIG. 5 is a flowchart of the software used to control the computer in a preferred embodiment of the present invention.

DETAILED DESCRIPTION OF THE PREFERRED EMBODIMENT

Overall System Structure

FIG. 1 is a diagram showing the arrangement of the components of the calibration system in a preferred embodiment. A reflection chamber 10 includes a wafer platform 12 upon which a wafer 14 is placed during a reflectivity test. A black body radiation source 16 provides infrared light to be reflected off of a backside 18 of wafer 14. A first pyrometer 20 mounted adjacent to black body radiation source 16 detects the amount of light reflected off of backside 18 of wafer 14.

The calibration system contains a processing chamber 30 for processing wafers A transfer arm 21 is used to swing wafer 14 from reflection chamber 10 to processing chamber 30 in a loading operation. A lamp 32 is situated inside chamber 30 and above wafer 14. The wafer is seated on a wafer platform 34, similar to wafer platform 12 in reflection chamber 10. Below wafer platform 34 is a second pyrometer 36 for detecting the amount of light emitted by wafer 14 during processing.

First and second pyrometers 20, 36 have output lines 40, 42 connected to a computer 44. In addition, an output 46 indicating the power level of a power supply 47 of processing chamber 30 is connected to computer 44 Each of these output lines 40, 42, 46 provide computer 44 with data for setting the processing chamber for the characteristics of a particular wafer. A computer output line 48 is connected to a control input for power supply 47 so that computer 44 may set lamp 32 at the proper level for processing. Computer 44 is provided with a keyboard 50 and a display 52 so that a user may interact with the system to access and input data.

System Operation

The operation of the present invention will now be described with reference to FIG. 1. Calibration of the processing system for processing semiconductor wafers is carried out in a series of three steps conducted on three different wafers.

1. Thermocouple Calibration

First, a thermocouple wafer 60 is placed on wafer platform 34 in processing chamber 30. FIG. 2 shows a thermocouple wafer 60 used for calibrating the system to a rough initial level. Thermocouple wafer 60 includes an imbedded thermocouple 62 located at the core of thermocouple wafer 60 for detecting the core temperature of thermocouple wafer 60 as the temperature of processing chamber 30 is increased. A high melting temperature thermocouple (such as Type C* - tungsten tungsten/rhenium) is preferably electron beam welded directly into the silicon wafer (rather than inserting a thermocouple into a hole in the wafer).

In this configuration, the wafer is mechanically very rugged and will survive many thermal cycles. The thermocouple junction is in intimate thermal contact with the wafer so the thermocouple temperature readout will be the same as the wafer temperature. Another advantage of this system is the lack of any foreign material on the wafer surface which would modify the coupling of radiation into the wafer. Finally, thermocouples can be added to any type of silicon wafer not just a bare one. This will be important in the overall calibration scheme. Additionally, this calibration technique is applicable to materials other than silicon, e.g., GaAs, InP, InSb, etc.

A known power level is supplied to lamp 32, thereby heating thermocouple wafer 60 to a certain temperature. That temperature is detected by thermocouple 62. This data is then transmitted to computer 44 where the temperature is recorded in a first table in the memory of computer 44.

In addition, second pyrometer 36 detects the amount of light emitted by thermocouple wafer 60 at the known power level. This value is stored, along with the known power level and the corresponding temperature in the first table in the memory of computer 44.

The temperature of thermocouple wafer 60 is then increased a number of times. At each level the temperature and the corresponding light emission value are recorded in the first table. This table represents an initial rough calibration scale for semiconductor devices of similar composition to thermocouple wafer 60. Refinement of the values in the first table are accomplished by conducting tests (steps 2 and 3 described below) on a batch wafer and then a particular wafer to be processed.

The emissivity of silicon (ignoring surface or spectral effects) is relatively constant at temperatures above about 700° C, so emissivity calibration as a function of temperature is not strictly required if all processes are to run in a restricted temperature range and small (10–20° C) temperature errors can be tolerated. In practice, the system takes measurements at very small temperature increments at low temperatures where the emissivity is changing rapidly, and at larger steps at higher temperatures.

FIG. 3 is a chart of the calibration table values for the pyrometer output voltage versus temperature of a particular wafer measured by a preferred embodiment of the present invention. The vertical axis represents the pyrometer voltage level in millivolts. The horizontal axis represents the temperature in ° C.

Four curves are illustrated in FIG. 3 Curve 92 represents the pyrometer voltage versus temperature function of thermocouple wafer 60 at the lower end of the temperature range, i.e. 350–600° C. Curve 94 represents the pyrometer voltage versus temperature function of the same thermocouple wafer at a higher temperature range, i.e. 500–1275° C. The reason that two separate curves exist for the same wafer over the full ange of temperatures between 350 and 1275° C is that the pyrometer is switched to a higher gain at about 550° C. This causes a new curve to be started at a lower voltage level. Curves 96 and 98 reflect the adjustments done for the sample batch wafer and a particular individual wafer, respectively, at the high gain setting, as discussed later, similar curves are produced for the lower voltage range, but are not shown.

2. Rapid Reference

The second step, referred to as the rapid reference, consists of measuring characteristics of a batch wafer and creating an autocal calibration file for the pyrometer that is specific to those characteristics. A batch wafer is an arbitrary wafer selected from a batch of wafers of a particular lot which are to be processed. The autocal file is created by adjusting a file for the thermocouple wafers or another known good autocal file that is in the computer memory. The good autocal file is selected and is known as the source file. The batch wafer is placed on wafer platform 34 in processing chamber 30. The lamp is powered to one of the known power levels used in the first step described above (Power level A). Then, second pyrometer 36 detects the light emitted by the batch wafer P(mv) and transmits it to computer 44 on second pyrometer output line 42.

The computer then determines a temperature from the source autocal file that corresponds to P(mv) and calculates the difference in temperature between the indicated and the rapid reference calibration temperature that was measured during the thermocouple wafer calibration. The computer also corrects for variations in the pyrometer gain from system to system by determining the correction coefficient, $C_i$ that corresponds to the particular P(mv) from the empirically derived formula $C_i = A_o + A_i*P_i(mv)$. The numerical value of the coefficients $A_o$ and $A_i$ depend on the gain of the output amplifiers of the second pyrometer. The values of $C_i$ for each pyrometer output value $P_i$ have been previously determined in a calibration of the particular hardware. This calibration is done by plotting the temperature of a group of wafers for the same pyrometer output versus the reflectivity of those wafers. This is repeated over the range of pyrometer outputs. The equation describing the curve formed by this plot is $A_o + A_i*P_i(mv)$. By determining the values $A_o$ and $A_i$, only these two values need to be stored, with $C_i$ being calculated each time for a pyrometer reading $P_i$. Alternately, values of $C_i$ could be stored in memory for each $P_i$. There are functionally similar equations that provide the correction coefficients for both the high and low tables in the autocal file.

Using the temperature difference, $\Delta T$, and the Correction Coefficient, $C_i$, the computer calculates a Correction Constant, D. Using this Correction Constant each of the 256 temperatures in the high and low tables of the autocal file are corrected according to equation PS 1. D is determined from the equation $D = \Delta T/C_1$.

$$Tnew_i = T_i + D*C \quad (1)$$

Where:

$Tnew_i$ = new temperature value for the table in the ith position $Tnew_i$ = temperature value from the source autocal file in the ith position D = the Correction Constant calculated from the difference between the indicated and actual temperature $C_i$ = the Correction Coefficient corresponding to the ith position in the autocal table The newly calculated values are stored in a second table. The second table is a copy of the first table wherein the newly calculated values for light emission and temperature for the batch wafer are substituted for the values recorded for thermocouple wafer 60.

Curve 96 in FIG. 3 plots the values from the table for the batch wafer. Curve 96 represents a refinement of curve 94 based on measurements taken from the batch wafer. However, unlike curves 92 and 94, curve 96 is not a curve of actually measured values. Instead, curve 96 is an approximated curve determined by taking a single light emission reading from the batch wafer at a known power level A. The power level A and light emission value for the batch wafer are then used to predict a curve 96 for the batch wafer based on the measurements from curve 94 of the thermocouple wafer.

Rapid Reference works best at temperatures where emissivity is fairly constant, so 800° C. is normally chosen as the expected temperature (the known power level A). For process such as $TiSi_2$ and Al alloying which require lower temperatures, lower power levels can be used. It is important to remember that for Rapid Reference to work accurately, the front side 19 of the wafer must be stripped. Otherwise, the differences in the way the heat source couples into the wafer will drive the wafers to different equilibrium temperatures. Front side coupling and backside emissivity are related physical processes but must be considered independently in this case because of the different spectral ranges used for the heat source and pyrometer.

3. Automatically Compensate Emissivity (ACE~)

To obtain greater accuracy in some cases, step three, ACE, is performed which involves a reflectivity test performed on a particular wafer to be processed. Wafer 14 is placed on wafer platform 12 in reflection chamber 10. Black body source 16 provides an infrared light aimed at backside 18 of wafer 14. The amount of light reflected off of backside 18 is detected by first pyrometer 20. This value is transmitted to computer 44. This measurement is first done for the batch wafer of step 2 (autocal) or for the thermocouple wafer of step 1 and then for each individual wafer as it is loaded for processing.

The computer first determines the difference, R, in the reflectivity between the wafer to be processed and a reflectance value stored in the source autocal file for a thermocouple or batch wafer. This value, R, is similar in function to the correction constant of section 2. Using the source autocal file with its reference backside reflectivity value corresponding to the backside of the wafer used to create the file the computer then uses the following equation (2) to adjust the autocal file for the particular wafer that is about to be processed.

$$Tnew_i = T_i + R*C \quad (2)$$

Where:
- $Tnew_i$ = new temperature value for the table in the ith position
- $T_i$ temperature value from the source autocal file in the ith position
- R = the Correction Constant calculated from the difference between the measured reflectance and the reflectance value contained in the source autocal file
- $C_i$ = the Correction Coefficient corresponding to the ith position in the autocal table The correction coefficients, $C_i$ are the same that were used in equation 1.

The newly calculated values are inserted in a third table. The third table is a copied version of the second table in which the newly calculated values for the particular wafer can be substituted.

Curve 98 in FIG. 3 represents a further refinement of curve 96 to adjust curve 96 to take into account variations in a particular wafer to be processed. Curve 98 is approximated in the same manner as curve 96. That is, only one measurement is taken and the rest of the curve is predicted by reference to curve 96.

The ACE measurement works by measuring the backside reflectivity of each wafer just before entry into the process chamber. The optics of the reflectometer chamber 10 are carefully designed so that the measurements are made on the same location on the wafer as the pyrometer 36 in the processing chamber 30 will see. Therefore, any non-uniformity will not result in emissivity errors.

The reflectometer chamber 10 is an additional piece of hardware which mounts below the baseplate just to the left of the process chamber 30. As a wafer is held by transport arm 21 waiting to be loaded into the chamber, the system takes a reflectivity measurement. In this way there is essentially no reduction in the throughput of the system. The change in reflectivity from wafer to wafer is directly related to the change in emissivity, even at room temperature. The emissivity changes are calculated by the system computer. It is important to note that ACE does not measure emissivity, but only the small changes in emissivity from wafer to wafer within a lot. Normal variations of 10° to 20° C. are typical in some types of processes using standard closed loop temperature control. With ACE, the variations can be reduced to 1° to 2° C.

Although ACE is intended to compensate for small variations in backside emissivity it can often do a good job correcting for larger changes as well. One must be careful, however, because there may be some combinations of backside conditions which could fool this system if it is used to correct for large changes in emissivity. It is better to use the techniques discussed previously to make the gross emissivity corrections and to use ACE to compensate for the smaller variations within a lot.

System Electronics

FIG. 4 is a block diagram of the electronics used to implement a preferred embodiment of the present invention. Computer 44 is connected to various components of the system. First pyrometer 20, located in reflection chamber 10, is connected to computer 44 through a first analog to digital converter 70. The output signal of second pyrometer 36 is fed through an isolation amplifier 72 and a second analog to digital converter 74 before being input to computer 44.

A second isolation amplifier 73 is preferably provided in parallel to amplifier 72, with amplifier 73 having a higher gain for the high-end curves of FIG. 3. A switch 75, controlled by a line 77 from computer 44, allows quick switching between the two amplifiers, and thus between two gain levels. Alternately, a single amplifier could be used with a switch between two gain-setting resistors. However, this method could not be switched as quickly.

In order to use an optical pyrometer to measure a wide temperature span such as 350° C. to 1300° C. it is necessary to adjust the gain of the detector amplifier one or more times to obtain a measurable signal at low temperatures while not saturating the signal at high temperatures. In a conventional optical pyrometer this is accomplished by a manual adjustment of the gain with a variable resistor. In this invention the pyrometer temperature span is achieved by the use of two fixed gain resistors in the detector amplifier circuit. Alternatively, we could define the temperature resolution by using 3, 4 or a multitude of fixed gain resistors. The fixed gain resistors of the pyrometer amplifier circuit can be switched mechanically using the machine's computer control to obtain ooverage of the entire temperature range. In the preferred embodiment of the invention there are parallel amplifier circuits to the pyrometer detector, each with a different fixed gain. Again, there can be two or more of these parallel circuits. Each circuit is connected to the computer through parallel input ports. The computer then selects which input to read based on the temperature range of interest. This method is much faster since the computer can select an input much faster than a mechanical relay can change a resistor.

An input 76 for connecting to the imbedded thermocouple 62 is located on processing chamber 30. Input 76 is connected to computer 44 through thermocouple (TC) amplifier 78 and third analog to digital converter 80.

Lamp power source (LPS) 82 is connected to computer 44. LPS 82 both transmits a power level readout to, and receives a power level control signal from, computer 44 in order to control the processing of wafers in processing chamber 30.

A recorder output 84 is connected to computer 44 through first digital to analog computer 86. Recorder output 84 is used to provide a hard copy of any of the tables or the process history for a particular wafer.

Computer 44 runs the calibration system using rapid reference software 88. In the memory of computer 44 are stored the autocal tables 90 containing the values from the tests performed upon various wafers. In the preferred embodiment there are three autocal tables. The first contains temperature, power level, and light emission values for thermocouple wafer 60 shown in FIG. 2. The second table contains temperature, power level, and light emission values for a batch wafer. The third autocal table contains temperature, power level, and light emission values determined as a function of reflectivity for a particular wafer to be processed.

FIG. 5 is a flowchart of the software used to control the computer for making the temperature versus pyrometer output table in a preferred embodiment of the present invention. The lamp is first turned on (step A) and the pyrometer output value (Pypoint) is zeroed (step B). A timer is then started (step C) to give enough time for one measurement to be done. The pyrometer output is compared to a particular value being measured (step D). If the pyrometer value is greater than the selected point, the temperature is recorded (step E) and the next pyrometer point is selected (step F). If the timer has not run (step G) and the pyrometer output is not at its maximum (step H), step D is repeated. Otherwise, if the timer has run, the power is incremented (step I) and the timer is reset (step J) and the process is repeated Once the maximum pyrometer output has been reached, the lamp is turned off (step K) and the procedure is completed.

In general, to those skilled in the art to which this invention relates, many changes in construction and widely differing embodiments and applications of the present invention will suggest themselves without departing from its spirit and scope. For instance, a series of arc lamps or a conventional heating element could be used. The black body source could be placed in the heating chamber so a single pyrometer could be used. An error factor could be figured in the equations rather than stripping the top of the batch wafer. Thus, the disclosures and descriptions herein are purely illustrative and are not intended to be in any sense limiting. The scope of the invention is set forth in the appended claims.

What is claimed is:

1. An apparatus for calibrating a processing signal derived from characteristics of a semiconductor wafer, comprising:
   a processing chamber having a range of temperature settings including means for holding a calibration wafer;
   temperature measurement means coupled to the processing chamber for transmitting a signal indicating a temperature of said calibration wafer at a particular temperature setting;
   light emission masurement means coupled to said processing chamber for measuring an amount of light emitted by said calibration wafer at said particular temperature setting; and
   computer means for recording the amount of light emitted and temperature of said calibration wafer connected to the temperature measurement and light emission measurement means, including memory means for storing a first calibration table constructed from the measured light emission and temperature values used to determine a level of the processing signal, the computer means being programmed to recall and modify entries of the first calibration table according to light emission values of a sample batch wafer as measured by the light emission measurement means to generate a second calibration table and further programmed to calibrate said processing signal based on said entries of said second calibration table.

2. The apparatus of claim 1 wherein said computer means is programmed to provide said calibrated processing signal as a control signal to a power supply for said processing chamber.

3. The apparatus of claim 1 further comprising:
   light emission means for providing light to be reflected off of the sample batch wafer and a batch wafer;
   reflection measurement means for measuring intensity of light reflected off of said sample batch wafer and said batch wafer and providing a reflection signal to said computer means; and
   said computer means being programmed to modify said second calibration table in accordance with a difference in said reflection signal for said sample batch wafer and said batch wafer to generate a third calibration table.

4. The apparatus of claim 3 wherein said light emission means and said reflection measurement means are external to said processing chamber and further comprising a transfer arm for loading a particular wafer into said processing chamber and passing said particular wafer over said light emission means and reflection measurement means.

5. The apparatus of claim 3 wherein said light emission measurement means and said reflection means are infrared pyrometers.

6. An apparatus for calibrating a processing signal derived from characteristics of a semiconductor wafer, comprising:
   a processing chamber having a range of temperature settings including means for holding a calibration wafer;
   temperature measurement means coupled to the processing chamber for transmitting a signal indicating the temperature of said calibration wafer;

light emission measurement means coupled to said processing chamber for measuring an amount of light emitted by said calibration wafer;

light emission means for providing light to be reflected off of a sample batch wafer and said calibration wafer;

reflection measurement means for measuring the intensity of said light reflected off of said sample batch wafer and said calibration wafer and providing a reflection signal; and computer means for recording the amount of light emitted and temperature of said calibration wafer connected to the temperature measurement and light emission measurement means, including memory means for storing a first calibration table constructed from measured light emission and temperature values used to determine a level of the processing signal, the computer means being programmed to recall and modify the first calibration table in accordance with a difference in said reflection signal for said sample batch and calibration wafer to generate a second calibration table and to calibrate said processing signal based on said entries of said second calibration table.

7. An apparatus for calibrating a processing signal derived from characteristics of a semiconductor wafer, comprising:

a processing chamber including means for holding said wafer;

a long arc lamp for heating said processing chamber to a range of temperature;

a power supply for said long arc lamp;

temperature measurement means coupled to the processing chamber for transmitting a signal from a thermocouple attached to a calibration wafer for indicating the temperature of the calibration wafer;

a first infrared pyrometer coupled to said processing chamber for measuring an amount of light emitted by the calibration wafer;

light emission means mounted outside said processing chamber for providing infrared light to be reflected off a particular wafer;

a second infrared pyrometer mounted outside said processing chamber for measuring the intensity of said light reflected off of said particular wafer and providing a reflection signal;

a transfer arm for loading said particular wafer into said processing chamber and passing said particular wafer over said light emission means and said second infrared pyrometer; and computer means for recording the amount of light emitted and temperature of the calibration wafer connected to the temperature measurement and light emission measurement means, including memory means for storing a first calibration table constructed from the measured light emission and temperature values used to determine a level of the processing signal, the computer means being programmed to recall and modify entries of said first calibration table according to light emission values of a sample batch wafer as measured by the first pyrometer to generate a second calibration table, said computer means being programmed to modify a light emission value from said second pyrometer with said second calibration table and to provide a modified signal as a control signal to said power supply for said processing chamber, said computer means also being programmed to modify said second calibration table in accordance with a difference in said reflection signal between a batch wafer and one of said sample batch and calibration wafers to generate a third calibration table and to calibrate said processing signal based on said entries of said third calibration table.

* * * * *